(12) United States Patent
Ito et al.

(10) Patent No.: US 7,357,490 B2
(45) Date of Patent: Apr. 15, 2008

(54) ACTUATOR DEVICE, LIQUID JET HEAD AND LIQUID JET APPARATUS

(75) Inventors: Maki Ito, Suwa (JP); Xin-Shan Li, Suwa (JP); Masami Murai, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 420 days.

(21) Appl. No.: 11/056,207

(22) Filed: Feb. 14, 2005

(65) Prior Publication Data

US 2005/0190239 A1    Sep. 1, 2005

(30) Foreign Application Priority Data

Feb. 13, 2004   (JP)   ............................. 2004-037288

(51) Int. Cl.
*B41J 2/045*    (2006.01)
(52) U.S. Cl. .......................... 347/68; 347/70
(58) Field of Classification Search ............ 347/68–72; 310/324; 501/134; 252/62.9 PZ
See application file for complete search history.

(56) References Cited

U.S. PATENT DOCUMENTS

2002/0123158 A1*   9/2002   Murai ........................... 438/3

FOREIGN PATENT DOCUMENTS

JP    2001-298219 A    10/2001

* cited by examiner

*Primary Examiner*—Stephen Meier
*Assistant Examiner*—Geoffrey S. Mruk
(74) *Attorney, Agent, or Firm*—Sughrue Mion, PLLC

(57) ABSTRACT

Provided are an actuator device, a liquid jet head and a liquid jet apparatus, which can improve reliability by preventing peeling-off of respective films forming a vibration plate. The vibration plate has a first oxide film (elastic film 50) formed on the one surface of a passage-forming substrate 10, and a second oxide film (insulation film 55) formed on the first oxide film 50 by use of a sputtering method. In only a part of an interface between the first and second oxide films 50 and 55, an altered layer is formed which has a first element that is a constituent element other than oxygen included in the first oxide film 50 and a second element that is a constituent element other than oxygen included in the second oxide film 55, and which is a layer in which a proportion of the first element is lower than that in the first oxide film 50 and a proportion of the second element is lower than that in the second oxide film 55. A proportion of the altered layer in the entire interface between the first and second oxide films 50 and 55 is not more than 10%.

6 Claims, 6 Drawing Sheets

SAMPLE A

SAMPLE A

SAMPLE B

ACTUATOR DEVICE, LIQUID JET HEAD AND LIQUID JET APPARATUS

BACKGROUND OF THE INVENTION

1. Field of the Invention

The present invention relates to an actuator device including a vibration plate provided on one surface of a substrate having pressure generating chambers formed therein and piezoelectric elements provided on the vibration plate. In addition, the present invention also relates to a liquid jet head and a liquid jet apparatus.

2. Description of the Related Art

An actuator device including piezoelectric elements displaced by applying a voltage is mounted, for example, on a liquid jet head ejecting liquid droplets or the like. As such a liquid jet head, there has been known, for example, an ink-jet recording head in which a part of pressure generating chambers communicating with nozzle orifices is formed of a vibration plate. The vibration plate thereof is deformed by piezoelectric elements, thus ink in the pressure generating chambers is pressurized and ink droplets are ejected from the nozzle orifices. There are two types of ink-jet recording heads which have been put to practical use, which include: one using a piezoelectric actuator device of a longitudinal vibration mode, which extends and contracts in an axial direction of a piezoelectric element; and one using a piezoelectric actuator device of a flexure vibration mode.

Here, as the latter ink-jet recording head, there has been known one including: a passage-forming substrate in which pressure generating chambers communicating with nozzle orifices are formed; and piezoelectric elements provided on one surface of the passage-forming substrate with a vibration plate interposed therebetween (for example, see Patent Document 1). Moreover, the vibration plate of this ink-jet recording head is formed of a silicon oxide film formed by thermally oxidizing the one surface of the passage-forming substrate, and a zirconium oxide film formed on this silicon oxide film.

In such an ink-jet recording head, there is a problem that adhesion of the silicon oxide film and the zirconium oxide film, which form the vibration plate, is not sufficient and that both films are peeled off or the like. Note that such a problem exists not only in the actuator device mounted on the liquid jet head such as the ink-jet recording head but also in an actuator device mounted on another head.

[Patent Document 1]

Japanese Patent Laid-Open No. 2001-298219 ([0037] and [0038], FIG. 1)

SUMMARY OF THE INVENTION

In consideration for the circumstances as described above, it is an object of the present invention to provide an actuator device, a liquid jet head and a liquid jet apparatus, which can improve reliability by preventing peeling-off of respective films forming a vibration plate.

A first aspect of the present invention for achieving the foregoing object is an actuator device including: a vibration plate provided on one surface of a passage-forming substrate having pressure generating chambers formed therein; and a piezoelectric element which is provided on the vibration plate and is formed of a lower electrode, a piezoelectric layer and an upper electrode. The vibration plate has a first oxide film formed on the one surface of the passage-forming substrate, and a second oxide film formed on the first oxide film by use of a sputtering method. In only a part of an interface between the first and second oxide films, an altered layer is formed which has a first element that is a constituent element other than oxygen included in the first oxide film and a second element that is a constituent element other than oxygen included in the second oxide film, and which is a layer in which a proportion of the first element is lower than that in the first oxide film and a proportion of the second element is lower than that in the second oxide film. A proportion of the altered layer in the entire interface between the first and second oxide films is not more than 10%. In the first aspect, since a proportion of the altered layer formed on the interface between the first and second oxide films is not more than 10%, adhesion of the first and second oxide films can be enhanced. Thus, peeling-off or coming apart of the first oxide film from the second oxide film can be prevented. Moreover, reliability can be improved.

A second aspect of the present invention is the actuator device according to the first aspect, characterized in that a maximum thickness of the altered layer is not more than 15 nm. In the second aspect, since the maximum thickness of the altered layer is not more than 15 nm, a height of a convex part formed on a surface of the second oxide film can be reduced under the influence of the altered layer. Thus, the influence that the convex part has on respective layers of a piezoelectric element formed on the second oxide film can be reduced.

A third aspect of the present invention is the actuator device according to one of the first and second aspects, characterized in that the first oxide film is a silicon oxide film and the second oxide film is a zirconium oxide film, and that, in the altered layer, a ratio Si/Zr of a proportion of Si that is the first element to a proportion of Zr that is the second element is within a range of 1.5/1.0 to 2.0/1.0. In the third aspect, since the proportion of the altered layer, in which the ratio Si/Zr of the proportion of Si to the proportion of Zr is within a predetermined range, is not more than 10%, adhesion of the silicon oxide film and the zirconium oxide film can be enhanced, and thus peeling-off of the both films can be prevented.

A fourth aspect of the present invention is a liquid jet head characterized in that a nozzle plate having nozzle orifices communicating with the pressure generating chambers is bonded to the other surface of the substrate in the actuator device according to any one of the first to third aspects. In the fourth aspect, a highly reliable liquid jet head can be relatively easily and surely realized.

A fifth aspect of the present invention is a liquid jet apparatus including the liquid jet head according to the fourth aspect. In the fifth aspect, a highly reliable liquid jet apparatus can be relatively easily and surely realized.

DESCRIPTION OF THE EMBODIMENTS

The present invention will be described in detail below based on embodiments.

Embodiment 1

Figure 1:
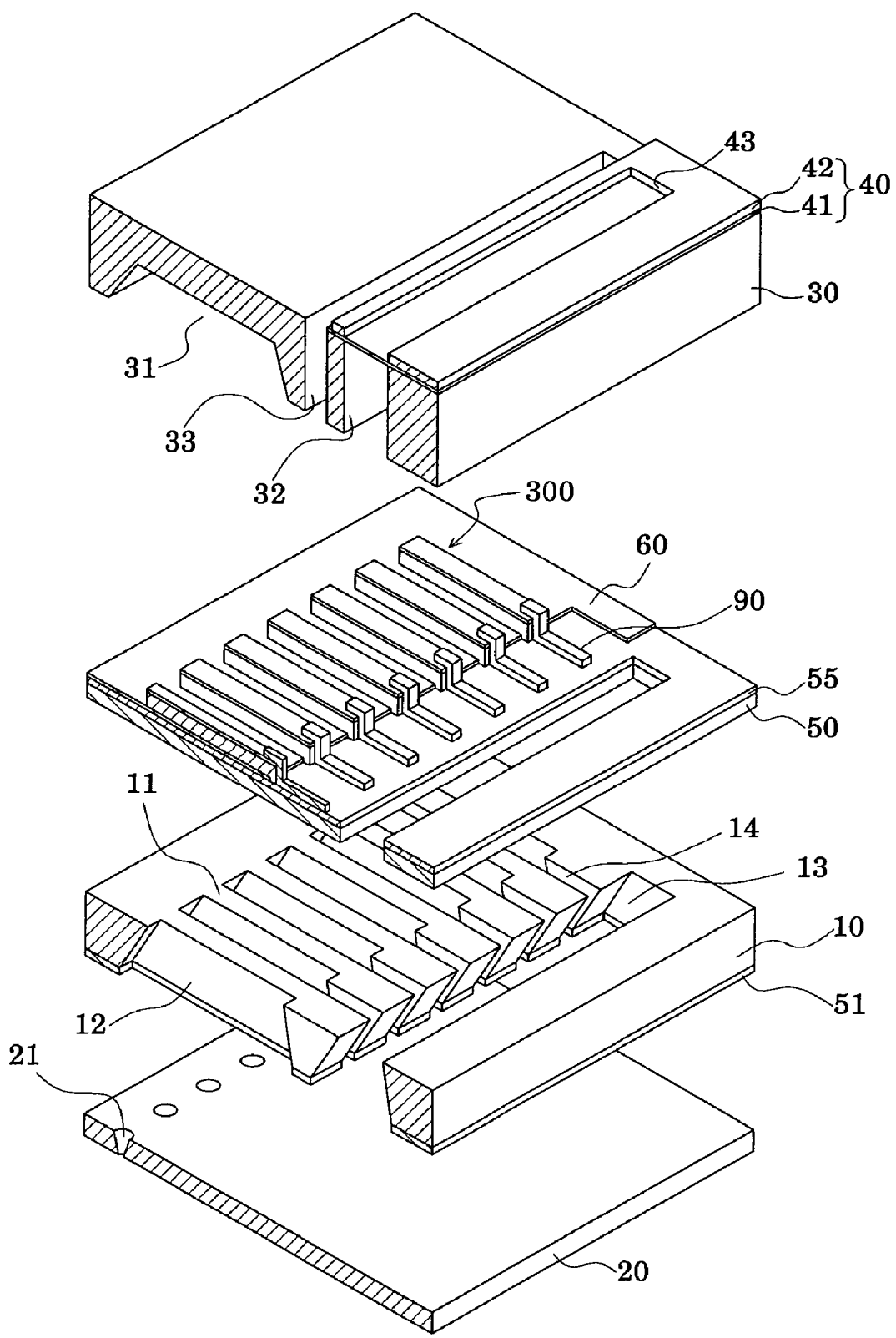
FIG. 1 is an exploded perspective view of a recording head according to embodiment 1.
Figure 2A:
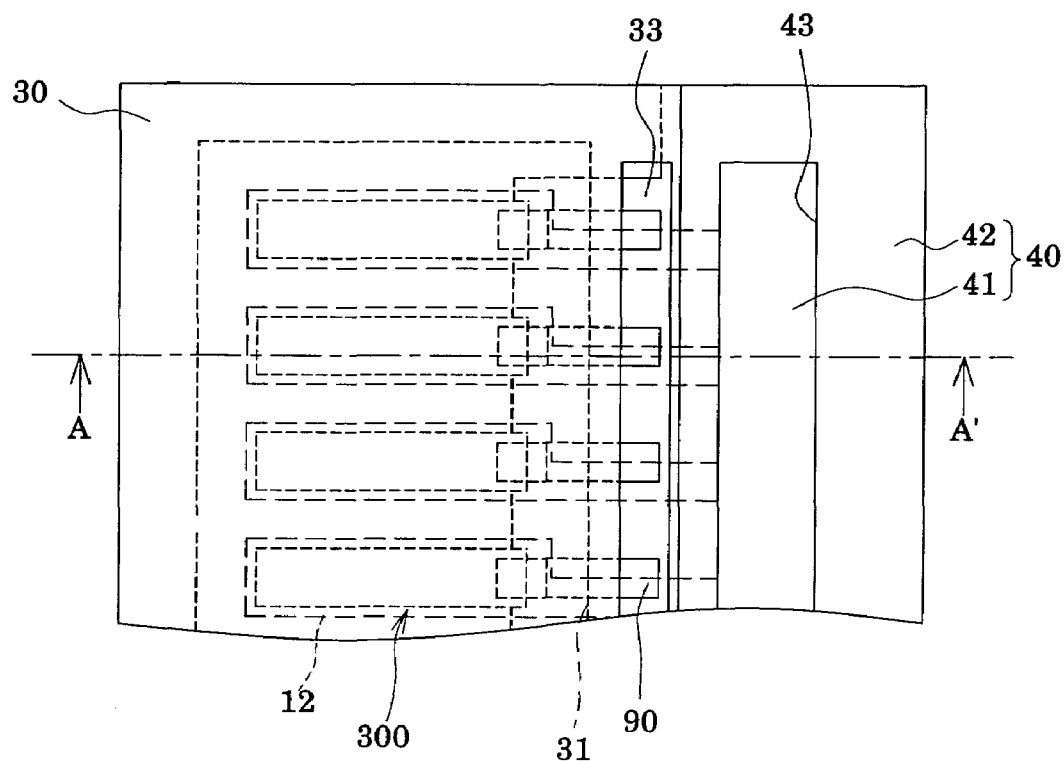
FIGS. 2A and 2B are a plan view and a cross-sectional view of the recording head according to embodiment 1.
Figure 2B:
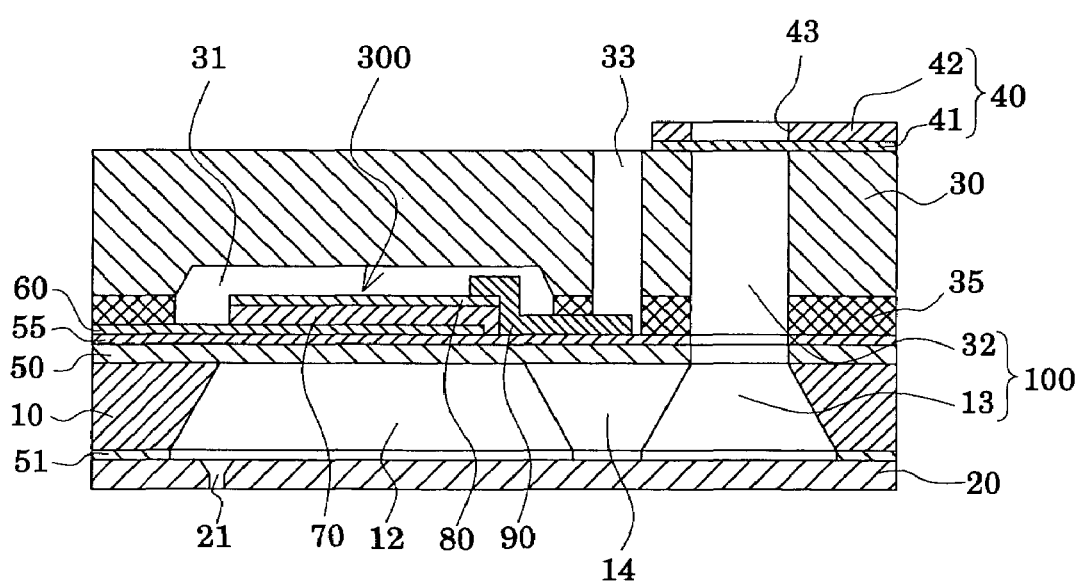

FIG. 1 is an exploded perspective view showing an ink-jet recording head according to Embodiment 1 of the present invention. FIGS. 2A and 2B are a plan view and a cross-sectional view of FIG. 1. As shown in FIG. 1, a passage-forming substrate 10 is made of a single crystal silicon substrate of plane orientation (110) in this embodiment and, on one surface thereof, an elastic film 50 with a thickness of 0.5 to 2 μm, that is a silicon oxide film, is previously formed by thermal oxidation. In the passage-forming substrate 10, a plurality of pressure generating chambers 12 is arranged in a width direction thereof. Moreover, on the outside in a longitudinal direction of the pressure generating chambers 12 in the passage-forming substrate 10, a communicating portion 13 is formed, which communicates with each of the pressure generating chambers 12 through an ink supply path 14 provided for each of the pressure generating chambers 12. Note that the communicating portion 13 communicates with a reservoir portion 32 in a protective plate 30 to be described later, and constitutes a part of a reservoir 100 to be a common ink chamber of the respective pressure generating chambers 12. The ink supply path 14 is formed to be narrower than the pressure generating chamber 12, and maintains a constant passage resistance of ink flowing into the pressure generating chamber 12 from the communicating portion 13.

Moreover, on an open face side of the passage-forming substrate 10, a nozzle plate 20 having nozzle orifices 21 drilled therein is fixed by use of an adhesive agent, a thermowelding film or the like, with a mask film 51 interposed therebetween. Specifically, the mask film 51 is used as a mask in formation of the pressure generating chamber 12, and the nozzle orifices 21 communicate with the vicinity of end portions of the pressure generating chambers 12 at the opposite side to the ink supply paths 14. Note that the nozzle plate 20 is made of glass ceramics having a thickness of, for example, 0.01 to 1 mm and a linear expansion coefficient of, for example, 2.5 to 4.5 [×$10^{-6}$/° C.] at 300° C. or less, a single crystal silicon substrate, stainless steel, or the like.

Meanwhile, on the side opposite to the open face of the passage-forming substrate 10, the elastic film 50 having a thickness of, for example, about 1.0 μm is formed as described above. On this elastic film 50, an insulation film 55 having a thickness of, for example, about 0.4 μm is formed. Furthermore, on this insulation film 55, a lower electrode film 60 having a thickness of, for example, about 0.2 μm, a piezoelectric layer 70 having a thickness of, for example, about 1.0 μm and an upper electrode film 80 having a thickness of, for example, about 0.05 μm are laminated by a process to be described later to constitute a piezoelectric element 300. Here, the piezoelectric element 300 means a part including the lower electrode film 60, the piezoelectric layer 70 and the upper electrode film 80. In general, the piezoelectric element 300 is formed by using any one of the electrodes thereof as a common electrode and patterning the other electrode and the piezoelectric layer 70 for each of the pressure generating chambers 12. Consequently, here, a part which includes any one of the electrodes, that is patterned, and the piezoelectric layer 70 and in which piezoelectric strain is caused by voltage application to the both electrodes is called a piezoelectric active portion.

In this embodiment, the lower electrode film 60 is used as the common electrode of the piezoelectric element 300, and the upper electrode film 80 is used as an individual electrode thereof. However, even if this order is reversed because of a drive circuit and wiring, there is no trouble caused thereby. In either case, the piezoelectric active portion is formed in each of the pressure generating chambers. Moreover, here, the piezoelectric element 300 and the vibration plate displaced by drive of the piezoelectric element 300 are collectively referred to as a piezoelectric actuator. Note that, in the example described above, the elastic film 50, the insulation film 55 and the lower electrode film 60 function as the vibration plate.

The elastic film 50 and the insulation film 55 will be described in detail below, which constitute at least a part of the vibration plate as described above. In this embodiment, on the elastic film 50 that is a first oxide film, the insulation film 55 that is a second oxide film is formed by use of a sputtering method such as a RF sputtering method and a DC sputtering method. In a part of an interface between the elastic film 50 and the insulation film 55, an altered layer (not shown) is formed. A proportion (existence ratio) of the altered layer in the entire interface between the elastic film 50 and the insulation film 55 is not more than 10%, more preferably, not more than 5%.

Here, the "altered layer" means a layer made of a composite oxide which has a first element that is a constituent element other than oxygen included in the elastic film (the first oxide film) 50, and a second element that is a constituent element other than oxygen included in the insulation film (the second oxide film) 55. Specifically, in the composite oxide, a proportion of the first element is lower than that in the elastic film 50, and a proportion of the second element is lower than that in the insulation film 55. Note that "the proportion of the element" here means relative proportions of elements included in the oxide.

For example, in the case where the elastic film 50 is a silicon oxide ($SiO_2$) film, and the insulation film 55 formed on the elastic film 50 is a zirconium oxide ($ZrO_2$) film, an altered layer is formed in a part of the interface between the elastic film 50 and the insulation film 55. Specifically, the altered layer includes Si to be the first element and Zr to be the second element. In addition, in the altered layer, a proportion of Si is lower than that in the elastic film 50, and a proportion of Zr is lower than that in the insulation film 55. In this case, a ratio Si/Zr of the proportion of Si in the altered layer to the proportion of Zr therein is within a range of 1.5/1.0 to 2.0/1.0.

According to the present invention, it is found out that such an altered layer adversely affects adhesion of the elastic film 50 to the insulation film 55. Thus, the present invention is made based on the knowledge that a proportion of the altered layer should be lower in order to improve the adhesion of the elastic film 50 to the insulation film 55. To be more specific, the proportion of the altered layer is varied depending on sputtering conditions in formation of the elastic film 50 that is the second oxide film, properties of the elastic film 50 and the insulation film 55, materials, and the like. Thus, these conditions are accordingly determined to set the proportion of the altered layer to not more than 10%. Consequently, sufficient adhesion of the elastic film 50 to the insulation film 55 can be obtained.

(Test Example)

Here, a test is conducted to compare adhesion of a silicon oxide film to a zirconium oxide film between a sample in which a proportion of an altered layer in the entire interface between the silicon oxide film and the zirconium oxide film is not more than 10% (Sample A) and a sample in which the proportion thereof is larger than 10% (Sample B).

Figure 3A:
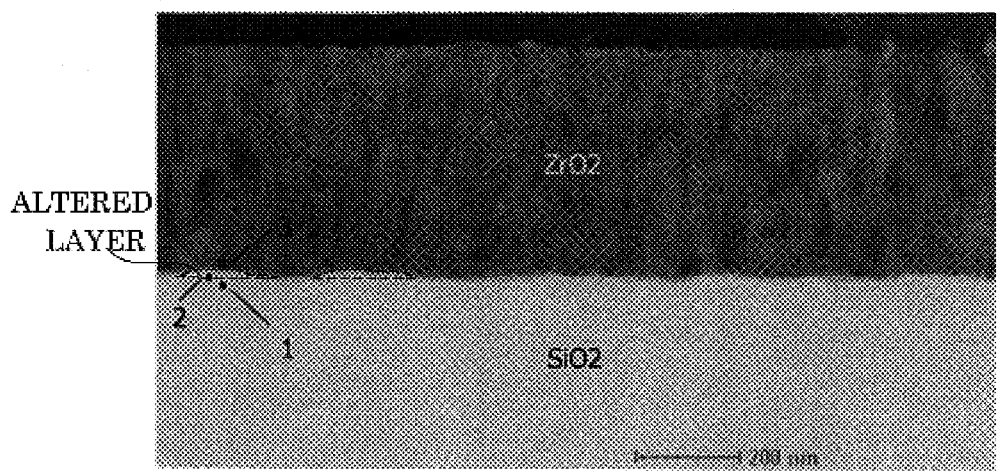
FIGS. 3A and 3B are SEM photographs of Samples A and B.
Figure 3B:
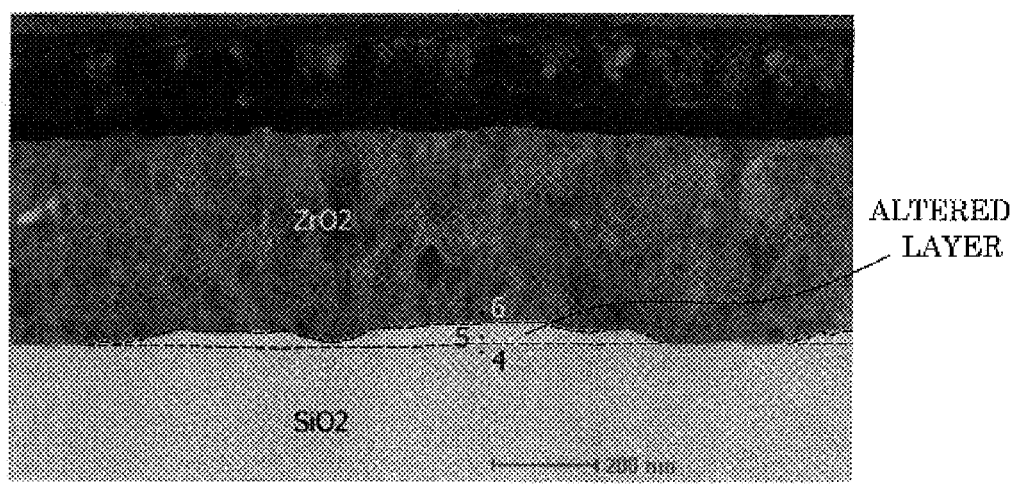

Specifically, Samples A and B are prepared in such a manner that, after a silicon oxide (SiO$_2$) film is formed by thermally oxidizing one surface of a single crystal silicon substrate, a zirconium oxide (ZrO$_2$) film is formed on this silicon oxide film by use of a sputtering method. Thereafter, as to these Samples A and B, proportions of altered layers in the entire interface between the silicon oxide film and the zirconium oxide film are obtained. As a result, the proportion in Sample A is about 5%, and the proportion in Sample B is about 50%. Note that, here, as the proportions of the altered layers in the entire interface between the silicon oxide film and the zirconium oxide film, ratios of lengths of the altered layers to a length of the interface between the silicon oxide film and the zirconium oxide film are obtained from SEM photographs of Samples A and B shown in FIGS. 3A and 3B.

Subsequently, as to these Samples A and B, a scratch test for the zirconium oxide film is conducted to compare adhesion therebetween. As a result, in Sample A, adhesion of about 150 mN or more is obtained. On the other hand, in Sample B, adhesion of only about 70 mN is obtained. From this result, it is found out that, compared with Sample B in which the proportion of the altered layer is larger than 10%, sufficient adhesion of the silicon oxide film to the zirconium oxide film can be obtained in Sample A in which the proportion of the altered layer is not more than 10%.

Moreover, element analyses are performed for respective portions of the altered layers (the dotted portions in FIGS. 3A and 3B) in Samples A and B described above, the silicon oxide film and the zirconium oxide film. Accordingly, proportions of Si and Zr are obtained. To be more specific, the element analyses are performed for the silicon oxide film in the portions indicated by Numbers 1 and 4 in FIGS. 3A and 3B, the altered layer in the portions indicated by Numbers 2 and 5 in FIGS. 3A and 3B, and the zirconium oxide film in the portions indicated by Numbers 3 and 6 in FIGS. 3A and 3B, respectively. Accordingly, the proportions of Si and Zr in the portions indicated by respective Numbers 1 to 6 are obtained. The results are shown in Table 1 below.

TABLE 1

|  | Number | Si (%) | Zr (%) |
|---|---|---|---|
| Sample A | 1 | 25.7 | 1.3 |
|  | 2 | 16.9 | 9.0 |
|  | 3 | 1.9 | 29.6 |
| Sample B | 4 | 24.7 | 1.0 |
|  | 5 | 15.4 | 9.0 |
|  | 6 | 4.8 | 26.6 |

From the results shown in Table 1, it is possible to determine that the altered layers in Samples A and B (the portions indicated by Numbers 2 and 5) are layers in which the proportion of Si is lower than that in the silicon oxide film and the proportion of Zr is lower than that in the zirconium oxide film. Moreover, it is possible to determine that the ratio Si/Zr of the proportion of Si to the proportion of Zr is within a range of 1.5/1.0 to 2.0/1.0.

As described above, in the present invention, the proportion of the altered layer in the entire interface between the elastic film 50 (the first oxide film) and the insulation film 55 (the second oxide film) is not more than 10%. Thus, the adhesion of the elastic film 50 to the insulation film 55 can be enhanced, and peeling-off or coming apart of the elastic film 50 from the insulation film 55 can be prevented. Moreover, reliability of the head can be improved.

Moreover, in the present invention, it is preferable that a maximum thickness of such an altered layer, in other words, a maximum height thereof from a surface of the elastic film 50 is not more than about 15 nm. Specifically, when the insulation film 55 is formed on the elastic film 50, the insulation film 55 is influenced by the altered layer formed on the surface of the elastic film 50. As a result, on a surface thereof in a portion facing the altered layer, a convex part is formed. Thus, if the maximum thickness of the altered layer is increased, a maximum height of the convex part formed on the surface of the insulation film 55, that is, the maximum height of the convex part from the surface of the insulation film 55 is also increased. Accordingly, such a convex part influences the respective layers of the piezoelectric element 300 formed on the insulation film 55. Particularly, in this embodiment, since the respective layers included in the piezoelectric element 300 are formed of thin films, the influence that the convex part on the surface of the insulation film 55 has on the respective layers of the piezoelectric element 300 formed thereon is increased. Consequently, it is preferable that the maximum height of the altered layer is not more than about 15 nm.

Note that, as a material to form the piezoelectric layer 70 included in the piezoelectric element 300, for example, a ferroelectric/piezoelectric material such as lead-zirconate-titanate (PZT), a relaxer ferroelectric substance, which is obtained by adding metal such as niobium, nickel, magnesium, bismuth, yttrium or the like to the ferroelectric/piezoelectric material, and the like are used. A composition thereof may be accordingly selected in consideration for properties of the piezoelectric element 300, applications thereof and the like. For example, PbTiO$_3$ (PT) PbZrO$_3$ (PZ), Pb (Zr$_x$Ti$_{1-x}$) O$_3$ (PZT), Pb (Mg$_{1/3}$Nb$_{2/3}$) O$_3$—PbTiO$_3$ (PMN-PT), Pb (Zn$_{1/3}$Nb$_{2/3}$) O$_3$—PbTiO$_3$ (PZN-PT), Pb (Ni$_{1/3}$Nb$_{2/3}$) O$_3$—PbTiO$_3$ (PNN-PT), Pb (In$_{1/2}$Nb$_{1/2}$) O$_3$—PbTiO$_3$ (PIN-PT), Pb (Sc$_{1/2}$Ta$_{1/2}$) O$_3$—PbTiO$_3$ (PST-PT), Pb (Sc$_{1/2}$Nb$_{1/2}$) O$_3$—PbTiO$_3$ (PSN-PT) BiScO$_3$—PbTiO$_3$ (BS-PT), BiYbO$_3$—PbTiO$_3$ (BY-PT) and the like can be cited.

Moreover, on the surface of the passage-forming substrate 10 at the piezoelectric element 300 side, the protective plate 30 is bonded by use of an adhesive agent 35. Specifically, the protective plate 30 has a piezoelectric element holding portion 31 capable of securing a space without interfering with movement of the piezoelectric element 300 in a region facing the piezoelectric element 300. Since the piezoelectric element 300 is formed inside this piezoelectric element holding portion 31, the piezoelectric element is protected in a state of being hardly influenced by the external environment. The piezoelectric element holding portion 31 may be unnecessarily sealed.

Furthermore, in the protective plate 30, the reservoir portion 32 which constitutes at least a part of the reservoir 100 is provided. In this embodiment, this reservoir portion 32 is provided along the width direction of the pressure generating chambers 12 while penetrating the protective plate 30 in its thickness direction. As described above, the reservoir portion 32 constitutes the reservoir 100 to be the common ink chamber of the respective pressure generating chambers 12 by communicating with the communicating portion 13.

Moreover, in a region between the reservoir portion 32 and the piezoelectric element holding portion 31 in the protective plate 30, a through-hole 33 is provided, which penetrates the protective plate 30 in its thickness direction.

Inside this through-hole 33, the vicinity of an end of a lead electrode 90 drawn from each piezoelectric element 300 is exposed. Note that, as a material of the protective plate 30, for example, glass, a ceramic material, metal, resin and the like are cited. However, it is preferable that the protective plate 30 is formed of a material having approximately the same thermal expansion coefficient as that of the passage-forming substrate 10. In this embodiment, the protective plate 30 is formed by use of a single crystal silicon substrate, which is the same material as that of the passage-forming substrate 10.

Moreover, on the protective plate 30, a compliance plate 40 including a sealing film 41 and a fixed plate 42 is bonded. The sealing film 41 is made of a material having low rigidity and flexibility (for example, a polyphenylene sulfide (PPS) film with a thickness of 6 μm), and this sealing film 41 seals one surface of the reservoir portion 32. Moreover, the fixed plate 42 is formed by use of a hard material such as metal (for example, stainless-steel (SUS) with a thickness of 30 μm). A region of this fixed plate 42, the region corresponding to the reservoir 100, is set to be an opening portion 43 which is obtained by entirely removing the fixed plate 42 in the region in its thickness direction. Thus, one side of the reservoir 100 is sealed only by the sealing film 41 having flexibility.

The ink-jet recording head of this embodiment as described above takes in ink from unillustrated external ink supply means and fills the inside thereof from the reservoir 100 to the nozzle orifices 21 with ink. Thereafter, in accordance with a recording signal from an unillustrated drive IC, a voltage is applied between the respective lower and upper electrode films 60 and 80 which correspond to the respective pressure generating chambers 12. Subsequently, the piezoelectric element 300 and the vibration plate are subjected to flexible deformation. Thus, pressures in the respective pressure generating chambers 12 are increased to eject ink from the nozzle orifices 21.

Figure 4A:
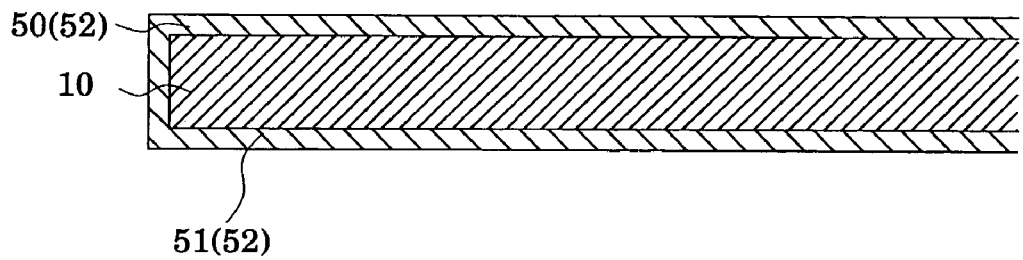
FIGS. 4A to 4D are cross-sectional views showing steps of manufacturing the recording head according to embodiment 1.
Figure 4B:
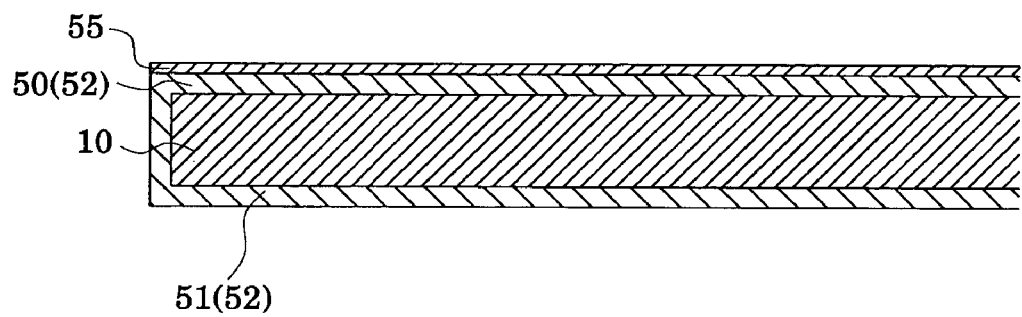
Figure 4C:
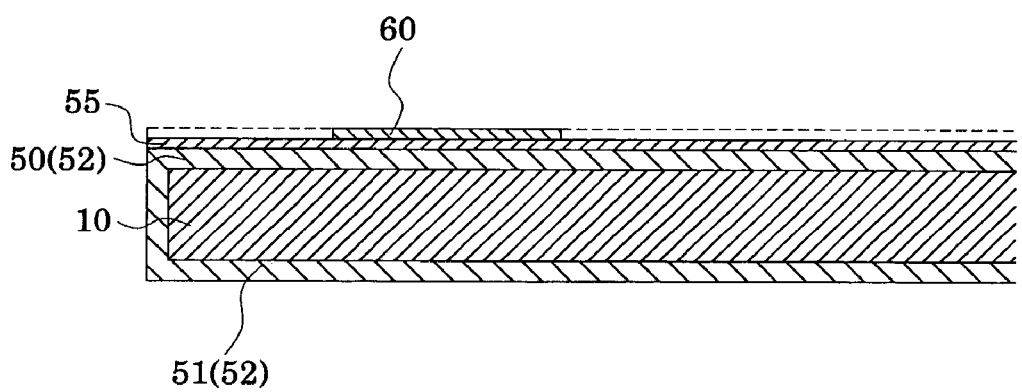
Figure 4D:
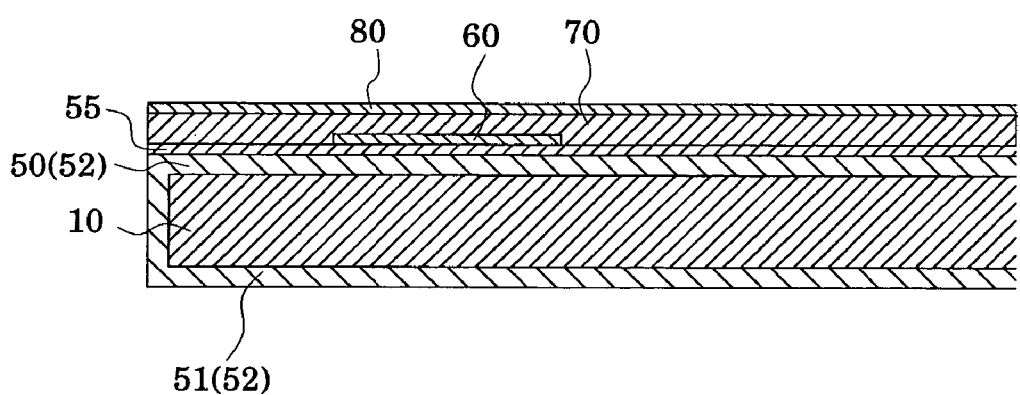

Here, with reference to FIGS. 4 and 5, a method for manufacturing such an ink-jet recording head will be described. Note that FIGS. 4A to 4D and FIGS. 5A to 5C are cross-sectional views in the longitudinal direction of the pressure generating chamber 12. First, as shown in FIG. 4A, a passage-forming substrate 10 that is a single crystal silicon substrate is thermally-oxidized in a diffusion furnace heated to about 1100° C. Thus, a silicon oxide film 52 to form an elastic film 50 and a mask film 51 is formed on a surface of the passage-forming substrate 10. Next, as shown in FIG. 4B, on the elastic film 50 (the silicon oxide film 52), an insulation film 55 is formed by use of a DC sputtering method in this embodiment. Specifically, the insulation film 55 that is a zirconium oxide ($ZrO_2$) film is formed by forming a zirconium (Zr) layer on the elastic film 50 and, thereafter, thermally-oxidizing the layer in a diffusion furnace heated to 500 to 1200° C., for example. Next, as shown in FIG. 4C, after a lower electrode film 60 is formed by laminating platinum and iridium, for example, on the insulation film 55, this lower electrode film 60 is patterned to have a predetermined shape. Next, as shown in FIG. 4D, a piezoelectric layer 70 made of, for example, lead-zirconate-titanate (PZT) or the like and an upper electrode film 80 made of, for example, iridium are formed on the entire surface of the passage-forming substrate 10.

Figure 5A:
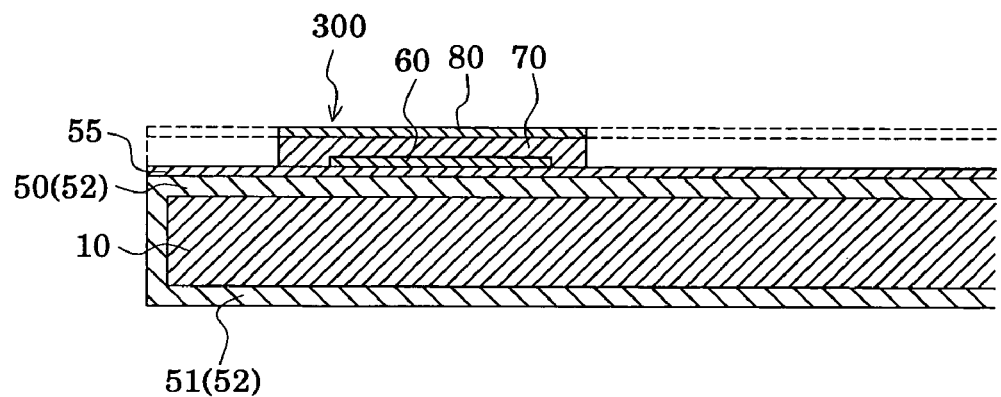
FIGS. 5A to 5C are cross-sectional views showing the steps of manufacturing the recording head according to embodiment 1.
Figure 5B:
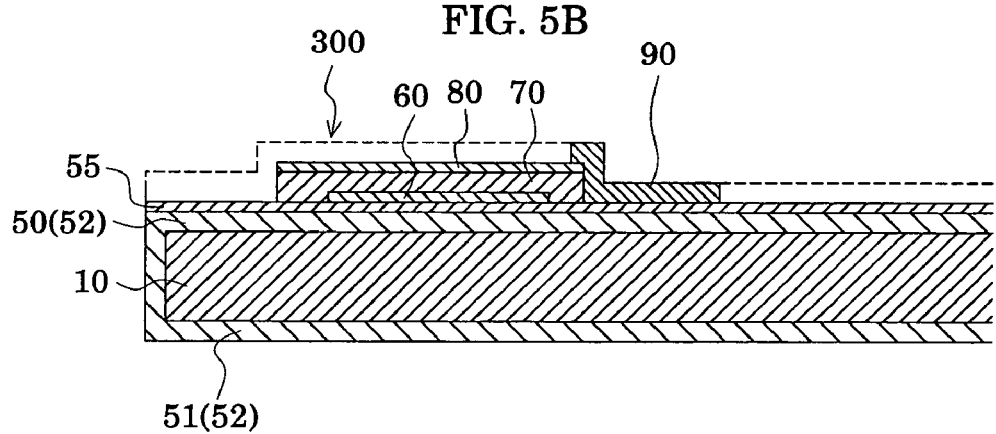
Figure 5C:
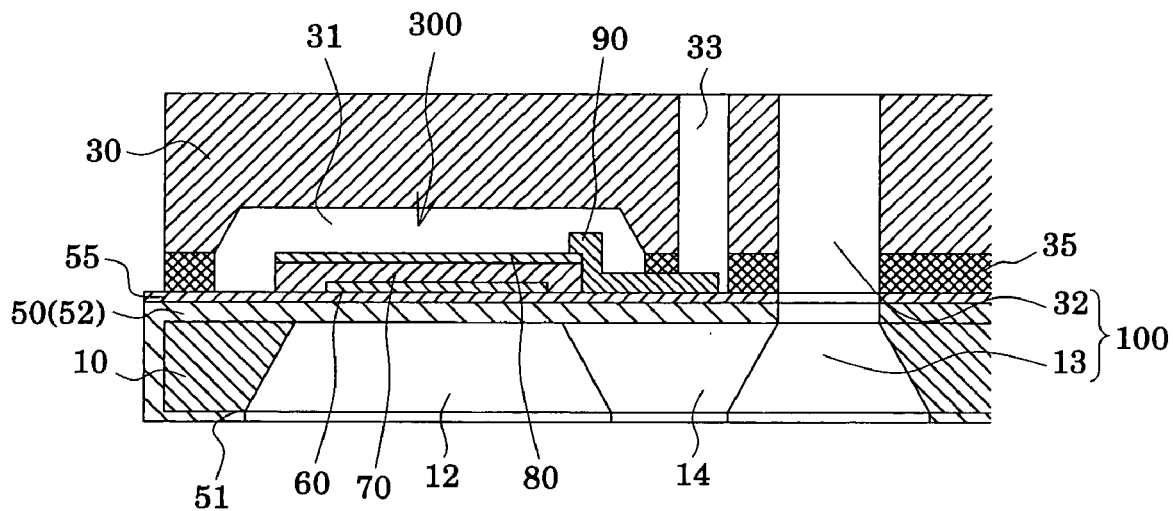

Next, as shown in FIG. 5A, the piezoelectric layer 70 and the upper electrode film 80 are patterned in a region facing each of the pressure generating chambers 12, thus forming a piezoelectric element, 300. Thereafter, as shown in FIG. 5B, a lead electrode 90 is formed. To be more specific, the lead electrode 90 is formed in such a manner that, after a metal layer made of, for example, gold (Au) or the like is formed on the entire surface of the passage-forming substrate 10, the metal layer is patterned for each of the piezoelectric elements 300 by means of a mask pattern (not shown) which is made of, for example, resist or the like. Next, after a protective plate 30 is bonded to the piezoelectric element 300 side on the passage-forming substrate 10 by use of an adhesive agent 35, as shown in FIG. 5(c), the other surface of the passage-forming substrate 10 is subjected to anisotropic etching by means of the mask film 51 patterned into a predetermined shape. Thus, the pressure generating chamber 12, an ink supply path 14 and a communicating portion 13 are formed. Next, the reservoir portion 32 in the protective plate 30 and the communicating portion 13 in the passage-forming substrate 10 are communicated with each other. Thus, a reservoir 100 including the reservoir portion 32 and the communicating portion 13 is formed.

Note that, thereafter, a nozzle plate 20 is bonded to the passage-forming substrate 10 with the mask film 51 interposed therebetween, and a compliance plate 40 is bonded to the protective plate 30. Subsequently, the passage-forming substrate 10 is divided into pieces with one chip size as shown in FIG. 1. Thus, the ink-jet recording head of this embodiment is obtained.

(Other Embodiment)

Although the embodiment of the present invention has been described above, the present invention is not limited to Embodiment 1 described above. For example, in Embodiment 1 described above, the ink-jet recording head in which the elastic film 50 is the silicon oxide film and the insulation film 55 is the zirconium oxide film has been described as an example. However, it is needless to say that the present invention is not limited thereto, and may be an ink-jet recording head in which the elastic film is an oxide film other than the silicon oxide film and the insulation film is an oxide film other than the zirconium oxide film.

Figure 6:
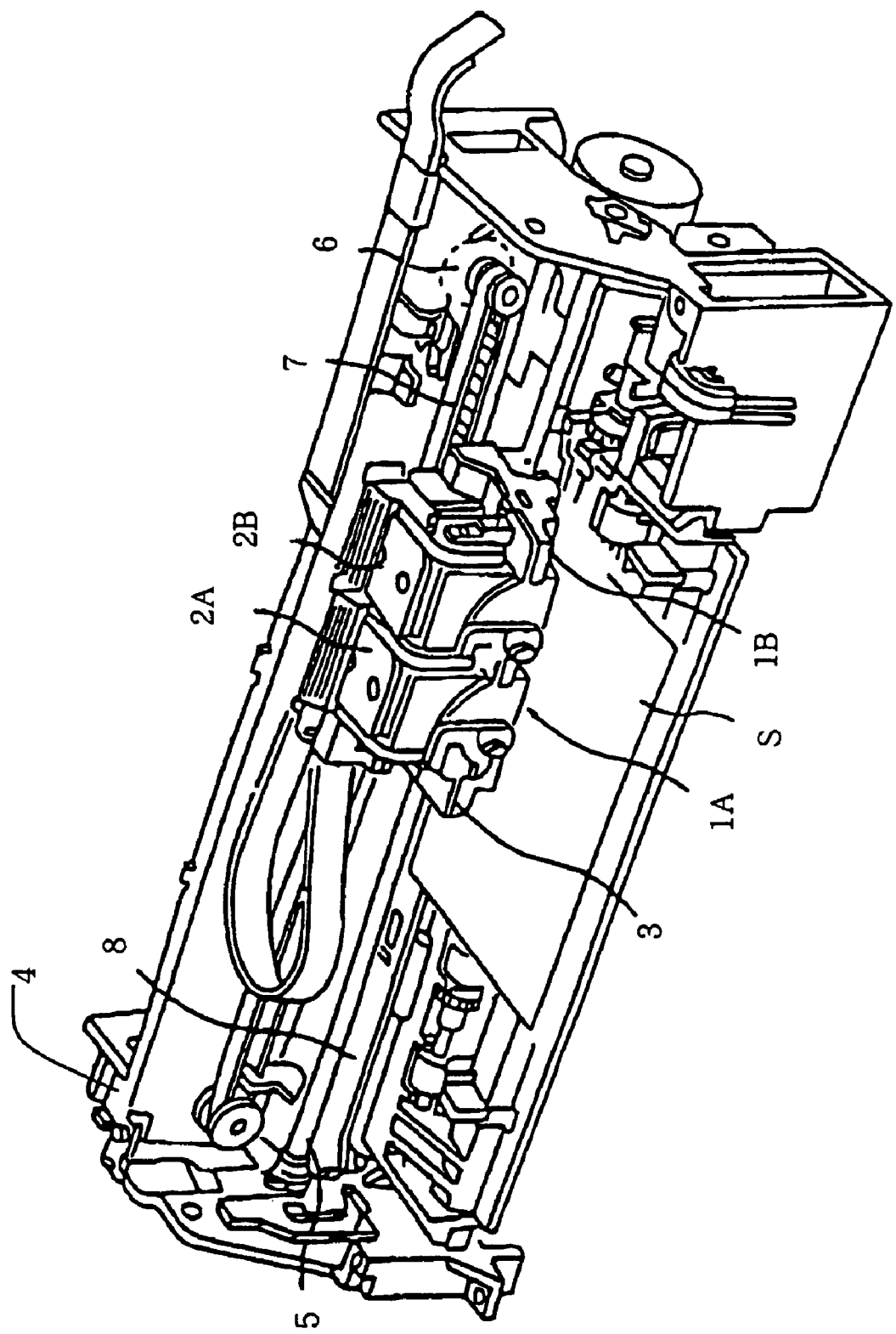
FIG. 6 is a schematic view of a recording apparatus according to an embodiment.

Note that the ink-jet recording head of the above-described embodiment forms a part of a recording head unit including an ink passage communicating with an ink cartridge and the like, and is mounted on an ink-jet recording apparatus. FIG. 6 is a schematic view showing an example of the ink-jet recording apparatus. As shown in FIG. 6, in recording head units 1A and 1B having the ink-jet recording heads, cartridges 2A and 2B included in ink supply means are detachably provided. A carriage 3 having these recording head units 1A and 1B mounted thereon is provided as movable in an axial direction on a carriage shaft 5 attached to an apparatus main body 4. These recording head units 1A and 1B are, for example, ones which eject a black ink composition and a color ink composition, respectively. A drive force of a drive motor 6 is transmitted to the carriage 3 via a plurality of unillustrated gears and a timing belt 7. Thus, the carriage 3 having the recording head units 1A and 1B mounted thereon is moved along the carriage shaft 5. Meanwhile, a platen 8 is provided along the carriage shaft 5 in the apparatus main body 4, and a recording sheet S that is a recording medium such as paper fed by an unillustrated feed roller or the like is carried on the platen 8.

Moreover, in the above-described embodiments, the ink-jet recording head has been described as an example of the liquid jet head of the present invention. However, the basic configuration of the liquid jet head is not limited to the one described above. The present invention is aimed widely at general liquid jet heads and, needless to say, can also be applied to ones ejecting liquids other than ink. As the other liquid jet heads, cited are, for example: various kinds of recording heads used in an image recording apparatus such as a printer; a color material jet head used for manufacturing color filters of a liquid crystal display and the like; an electrode material jet head used for forming electrodes of an organic EL display, a field emission display (FED) and the like; a bio-organic matter jet head used for manufacturing biochips; and the like. Moreover, the present invention can be applied not only to the actuator device mounted on the liquid jet head (ink-jet recording head) but also to actuator devices mounted on all kinds of apparatuses. For example, the actuator device can also be applied to a sensor and the like, besides the above-described head.

What is claimed is:

1. An actuator device comprising:
    a vibration plate provided on one surface of a passage-forming substrate having pressure generating chambers formed therein; and
    a piezoelectric element which is provided on the vibration plate and is formed of a lower electrode, a piezoelectric layer and an upper electrode, wherein:
        the vibration plate has a first oxide film formed on the one surface of the passage-forming substrate, and a second oxide film formed on the first oxide film by use of a sputtering method;
        in only a part of an interface between the first and second oxide films, an altered layer is formed which has a first element that is a constituent element other than oxygen included in the first oxide film and a second element that is a constituent element other than oxygen included in the second oxide film, and which is a layer in which a proportion of the first element is lower than that in the first oxide film and a proportion of the second element is lower than that in the second oxide film;
        the first oxide film is a silicon oxide film and the first element is Si, and the second oxide film is a zirconium oxide film and the second element is Zr, and, in the altered layer, a ratio Si/Zr of a proportion of Si that is the first element to a proportion of Zr that is the second element is within a range of 1.5/1.0 to 2.0/1.0.; and
        a proportion of the altered layer in the entire interface between the first and second oxide films is not more than 10%.

2. The actuator device according to claim 1, wherein a maximum thickness of the altered layer is not more than 15 nm.

3. A liquid jet head characterized in that a nozzle plate having nozzle orifices communicating with the pressure generating chambers is bonded to the other surface of the substrate in the actuator device according to claim 2.

4. A liquid jet apparatus comprising the liquid jet head according to claim 3.

5. A liquid jet head characterized in that a nozzle plate having nozzle orifices communicating with the pressure generating chambers is bonded to the other surface of the substrate in the actuator device according to claim 1.

6. A liquid jet apparatus comprising the liquid jet head according to claim 5.

* * * * *